US012597455B2

(12) United States Patent　　　(10) Patent No.:　US 12,597,455 B2
Sakai　　　　　　　　　　　　　　　(45) Date of Patent:　　Apr. 7, 2026

(54) MEMORY DEVICE AND MEMORY SYSTEM

(71) Applicant: SONY SEMICONDUCTOR SOLUTIONS CORPORATION, Kanagawa (JP)

(72) Inventor: Lui Sakai, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 109 days.

(21) Appl. No.: 18/683,278

(22) PCT Filed: Mar. 10, 2022

(86) PCT No.: PCT/JP2022/010560
§ 371 (c)(1),
(2) Date: Feb. 13, 2024

(87) PCT Pub. No.: WO2023/026537
PCT Pub. Date: Mar. 2, 2023

(65) Prior Publication Data
US 2024/0347091 A1　　Oct. 17, 2024

(30) Foreign Application Priority Data

Aug. 26, 2021　(JP) ................................. 2021-138062

(51) Int. Cl.
*G11C 11/16*　　　　　(2006.01)
(52) U.S. Cl.
CPC ........ *G11C 11/1675* (2013.01); *G11C 11/161* (2013.01); *G11C 11/1677* (2013.01)
(58) Field of Classification Search
CPC .............. G11C 11/1675; G11C 11/161; G11C 11/1677; G11C 11/1673; G11C 11/16; G11C 11/1659
See application file for complete search history.

(56) References Cited

U.S. PATENT DOCUMENTS 6,134,138　A　*　10/2000　Lu ........................... G11C 11/16
　　　　　　　　　　　　　　　　　　　　365/158
7,714,399　B2 *　5/2010　Morise ................ G11C 11/1675
　　　　　　　　　　　　　　　　　　　　365/158

(Continued)

FOREIGN PATENT DOCUMENTS

JP　　　2014-067929　A　　4/2014
JP　　　2017-112351　A　　6/2017
JP　　　2018-092696　A　　6/2018

OTHER PUBLICATIONS

International Search Report and Written Opinion of PCT Application No. PCT/JP2022/010560, issued on Apr. 26, 2022, 08 pages of ISRWO.

*Primary Examiner* — Jay W. Radke
(74) *Attorney, Agent, or Firm* — CHIP LAW GROUP

(57) ABSTRACT

Provided is a memory device that includes a magnetic memory element, an auxiliary magnetic field application unit, and a write control unit, in which the magnetic memory element includes a reference layer having a fixed magnetization direction, and a storage layer and having a reversible magnetization direction, and that stores data in association with two states of a parallel state and an anti-parallel state, the auxiliary magnetic field application unit applies an auxiliary magnetic field supporting transition of the magnetic memory element from the parallel state to the anti-parallel state, and the write control unit performs initialization by applying an initialization voltage and an initialization magnetic field to the magnetic memory element to bring the magnetic memory element into the anti-parallel state, and writing by performing state inversion to apply a state inversion voltage and a state inversion magnetic field to the initialized magnetic memory element, according to the data.

10 Claims, 20 Drawing Sheets

(56)                    References Cited

U.S. PATENT DOCUMENTS

| | | | |
|---|---|---|---|
| 2006/0034117 A1* | 2/2006 | Jeong | G11C 11/16 |
| | | | 365/158 |
| 2007/0064472 A1* | 3/2007 | Kawagoe | G11C 11/15 |
| | | | 365/158 |
| 2008/0197431 A1* | 8/2008 | Morise | H10N 50/10 |
| | | | 257/E27.005 |
| 2010/0220516 A1* | 9/2010 | Lee | G06F 30/39 |
| | | | 365/158 |
| 2014/0071743 A1* | 3/2014 | Kim | G11C 11/1655 |
| | | | 365/158 |
| 2017/0077395 A1* | 3/2017 | Han | H10N 50/10 |
| 2019/0347074 A1* | 11/2019 | Choi | H10B 61/22 |
| 2020/0174700 A1* | 6/2020 | Seong | G06F 3/0604 |

* cited by examiner

FIG.8

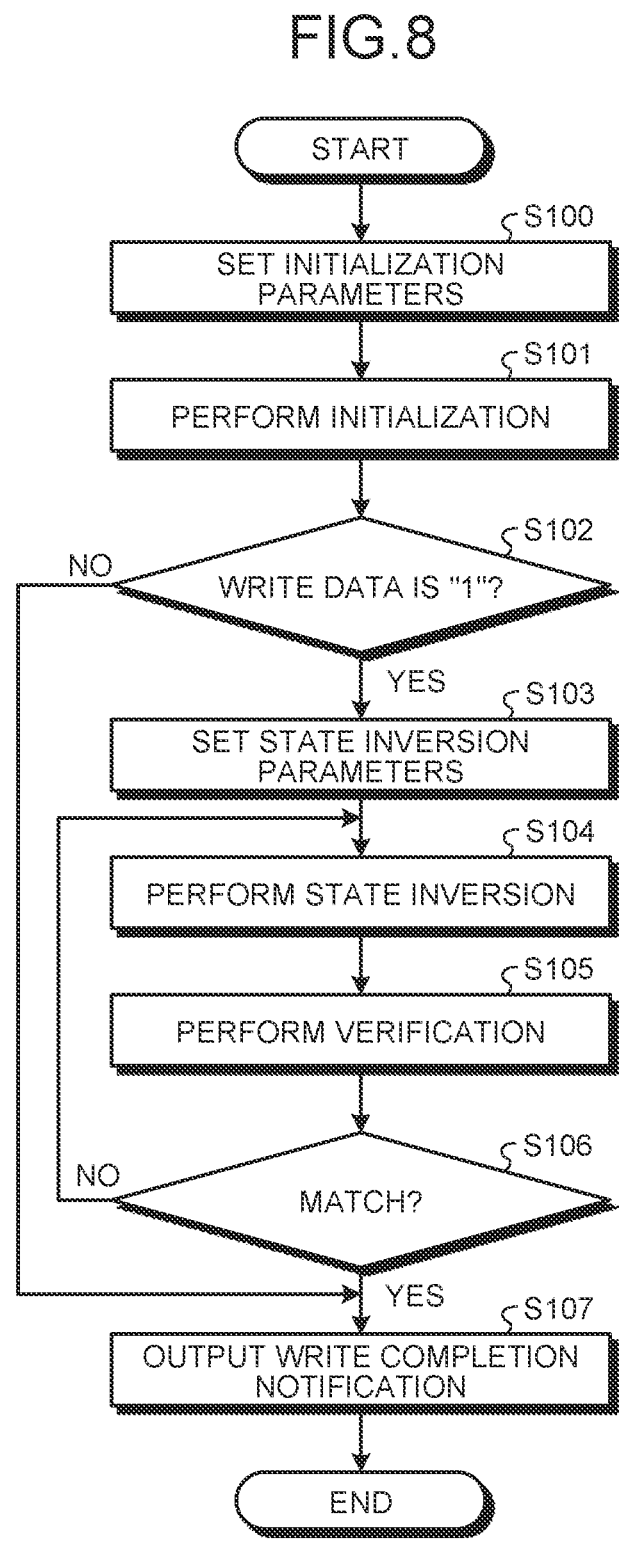

START

S100
SET INITIALIZATION PARAMETERS

S101
PERFORM INITIALIZATION

S102
WRITE DATA IS "1"?
NO
YES

S103
SET STATE INVERSION PARAMETERS

S104
PERFORM STATE INVERSION

S105
PERFORM VERIFICATION

S106
MATCH?
NO
YES

S107
OUTPUT WRITE COMPLETION NOTIFICATION

END

FIG.17

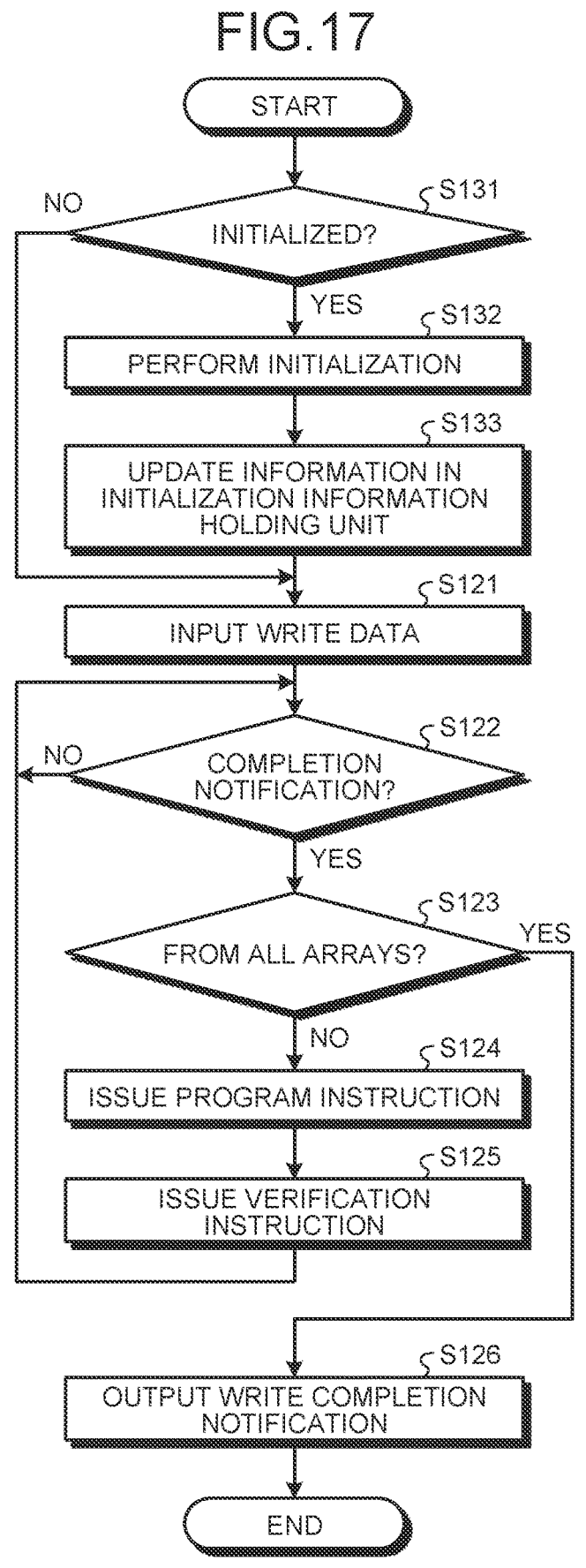

```
                    START

┌──────────────┐
      NO      │  INITIALIZED? │  ⌐S131
    ┌─────────┤              │
    │         └──────┬───────┘
    │              YES
    │                │              ⌐S132
    │         ┌──────▼───────────┐
    │         │ PERFORM INITIALIZATION │
    │         └──────┬───────────┘
    │                │              ⌐S133
    │         ┌──────▼───────────┐
    │         │ UPDATE INFORMATION IN │
    │         │ INITIALIZATION INFORMATION │
    │         │   HOLDING UNIT   │
    │         └──────┬───────────┘
    │                │              ⌐S121
    └───────►┌──────▼───────────┐
             │ INPUT WRITE DATA │
             └──────┬───────────┘
                    │
    ┌──────────────►│              ⌐S122
    │         ┌──────▼───────────┐
    │  NO     │   COMPLETION     │
    │◄────────┤  NOTIFICATION?   │
    │         └──────┬───────────┘
    │              YES
    │                │              ⌐S123
    │         ┌──────▼───────────┐  YES
    │         │  FROM ALL ARRAYS? ├─────┐
    │         └──────┬───────────┘     │
    │              NO                  │
    │                │      ⌐S124      │
    │         ┌──────▼───────────┐     │
    │         │ ISSUE PROGRAM INSTRUCTION │  │
    │         └──────┬───────────┘     │
    │                │      ⌐S125      │
    │         ┌──────▼───────────┐     │
    │         │ ISSUE VERIFICATION │    │
    │         │   INSTRUCTION    │     │
    │         └──────┬───────────┘     │
    └────────────────┘                 │
                     ┌─────────────────┘
                     │         ⌐S126
              ┌──────▼───────────┐
              │ OUTPUT WRITE COMPLETION │
              │   NOTIFICATION   │
              └──────┬───────────┘
                     │
                   END
```

INPUT DATA                                              320

| 1 | 1 | 1 | 1 | 1 | 0 | 1 | 1 | 1 | 0 | 1 | 1 | 1 | 0 | 1 | 1 | 1 |

LOGIC INVERSION DATA                                    321

| 0 | 0 | 0 | 0 | 0 | 1 | 0 | 0 | 0 | 1 | 0 | 0 | 0 | 1 | 0 | 0 | 0 | 1 |

ECC ENCODED DATA                                        321

| 0 | 0 | 0 | 0 | 0 | 1 | 0 | 0 | 0 | 1 | 0 | 0 | 0 | 1 | 0 | 0 | 0 | 1 | 0 | 1 | 0 | 1 | 0 |

322

MEMORY DEVICE AND MEMORY SYSTEM

CROSS REFERENCE TO RELATED APPLICATIONS

This application is a U.S. National Phase of International Patent Application No. PCT/JP2022/010560 filed on Mar. 10, 2022, which claims priority benefit of Japanese Patent Application No. JP 2021-138062 filed in the Japan Patent Office on Aug. 26, 2021. Each of the above-referenced applications is hereby incorporated herein by reference in its entirety.

FIELD

The present disclosure relates to a memory device and a memory system.

BACKGROUND

In a magnetoresistive RAM (MRAM) employing a magnetic memory element as a non-volatile storage element, a voltage controlled MRAM that writes data by applying a pulse voltage has been proposed (e.g., see Patent Literature 1). Upon writing data, this resistive random access memory of the conventional art reads data from the storage element and writes the data when the read data and the data to be written are different.

CITATION LIST

Patent Literature

Patent Literature 1: JP 2018-092696 A

SUMMARY

Technical Problem

However, in the conventional art described above, data is read when writing data, and therefore, there is a problem that a time period required for writing becomes long.

Therefore, the present disclosure proposes a memory device and a memory system that reduces a time period required for writing data.

Solution to Problem

A memory device according to the present disclosure includes: a magnetic memory element that includes a reference layer having a fixed magnetization direction, and a storage layer stacked on the reference layer via an insulating layer and having a reversible magnetization direction, and that stores data in association with two states of a parallel state and an anti-parallel state, the parallel state having the same magnetization directions in the reference layer and the storage layer and the anti-parallel state having different magnetization directions in the reference layer and the storage layer; an auxiliary magnetic field application unit that applies an auxiliary magnetic field supporting transition of the magnetic memory element from the parallel state to the anti-parallel state; and a write control unit that performs initialization by applying an initialization voltage and an initialization magnetic field to the magnetic memory element to bring the magnetic memory element into the anti-parallel state, and writing by performing state inversion to apply a state inversion voltage and a state inversion magnetic field to the initialized magnetic memory element, according to the data, the state inversion voltage and state inversion magnetic field being used to bring the magnetic memory element in the anti-parallel state, into the parallel state.

BRIEF DESCRIPTION OF DRAWINGS

FIG. 8 is a flowchart illustrating an example of a process procedure of a write process according to the first embodiment of the present disclosure.

3                                                                                   4

Figure 15:
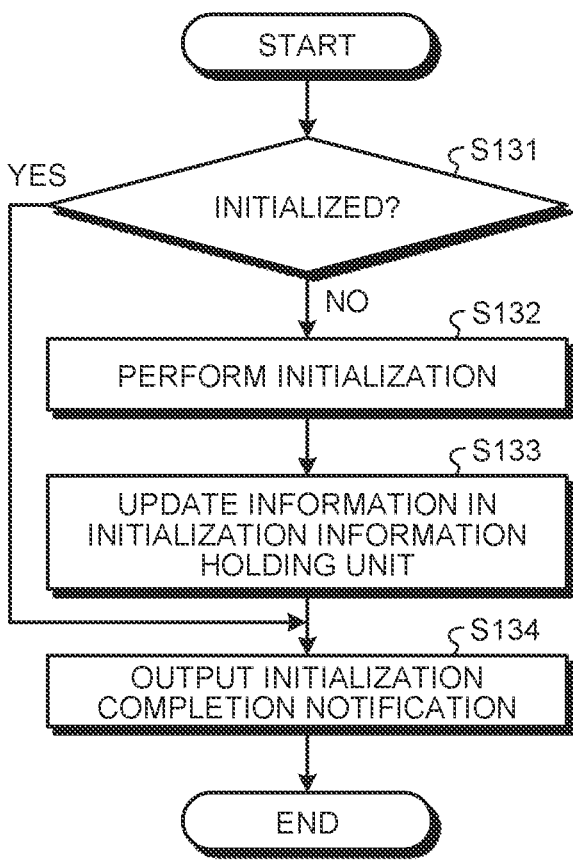

FIG. 15 is a flowchart illustrating an example of a process procedure of an initialization process according to the third embodiment of the present disclosure.

Figure 16:
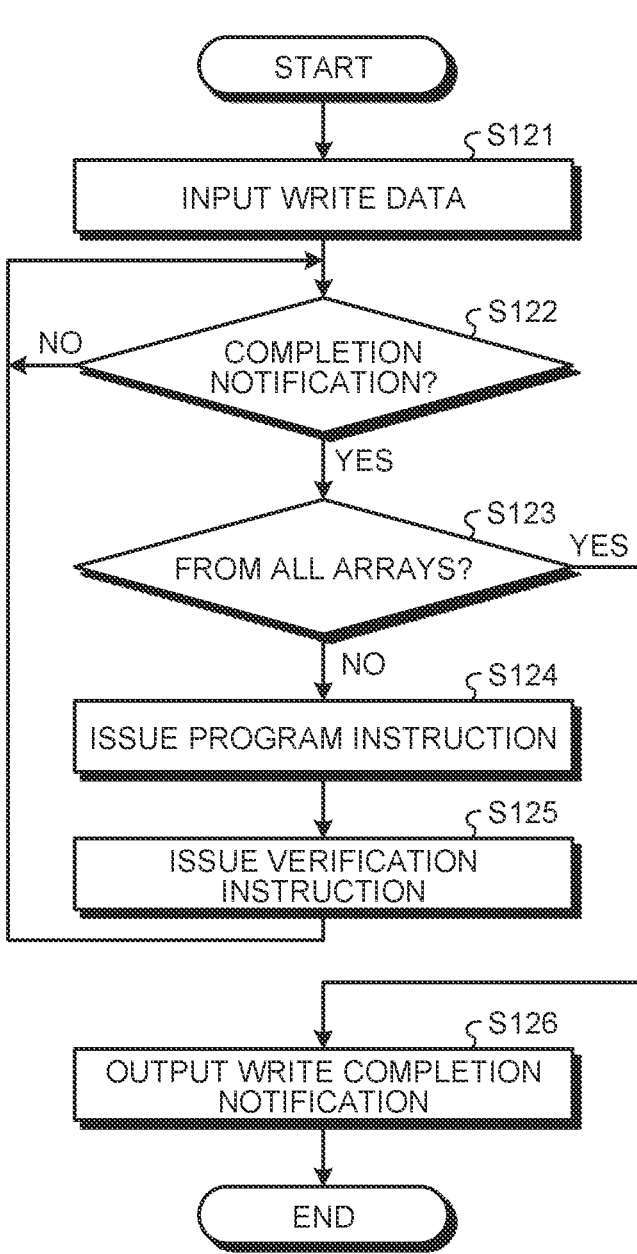

FIG. 16 is a flowchart illustrating an example of a process procedure of a write process according to the third embodiment of the present disclosure.

FIG. 17 is a flowchart illustrating an example of another process procedure of the write process according to the third embodiment of the present disclosure.

Figure 18:
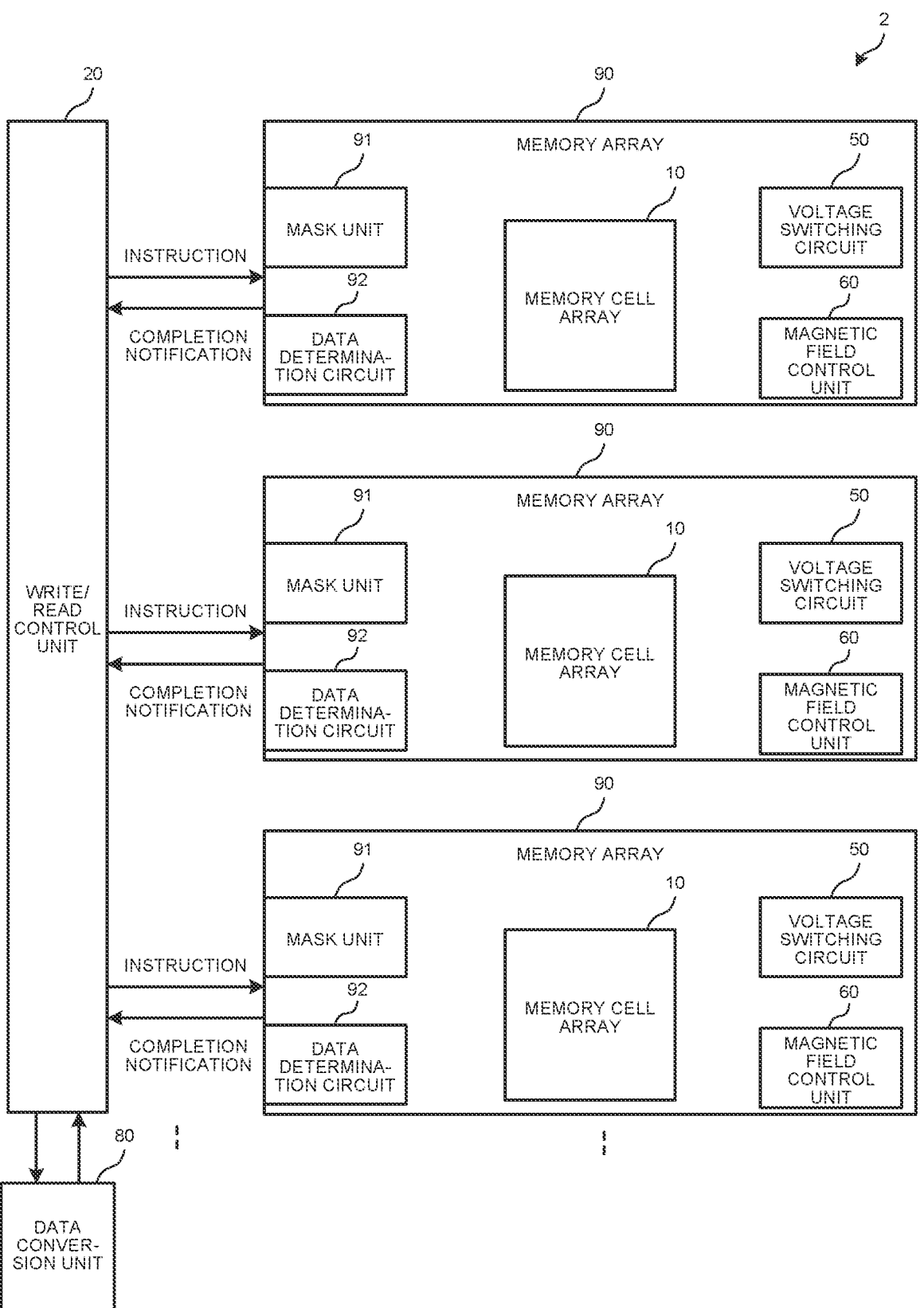

FIG. 18 is a diagram illustrating an exemplary configuration of a memory device according to a fourth embodiment of the present disclosure.

Figure 19:
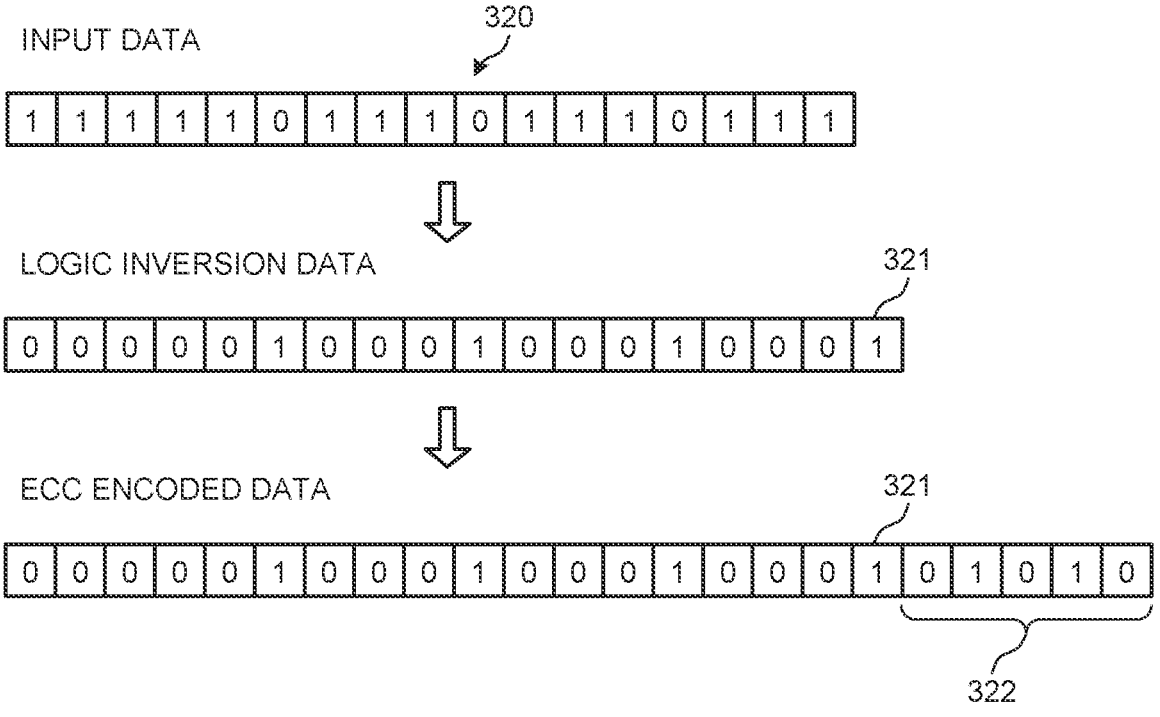

FIG. 19 is a diagram illustrating an example of data conversion according to the fourth embodiment of the present disclosure.

Figure 20:
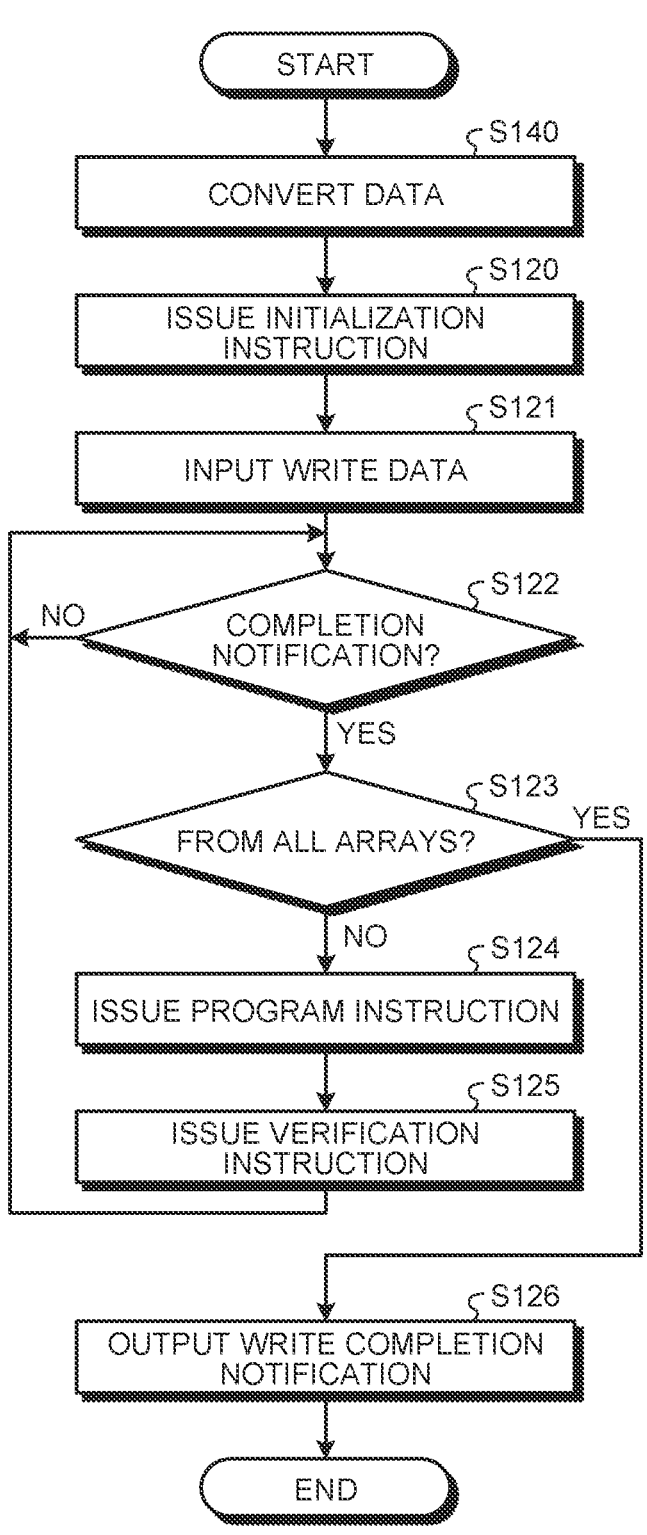

FIG. 20 is a flowchart illustrating an example of a process procedure of a write process according to the fourth embodiment of the present disclosure.

DESCRIPTION OF EMBODIMENTS

Embodiments of the present disclosure will be described in detail below with reference to the drawings. The description will be given in the following order. Note that in the following embodiments, the same portions are denoted by the same reference numerals and symbols, and repetitive description thereof will be omitted.
1. First Embodiment
2. Second Embodiment
3. Third Embodiment
4. Fourth Embodiment 1. First Embodiment

[Configuration of Memory System]

Figure 1:
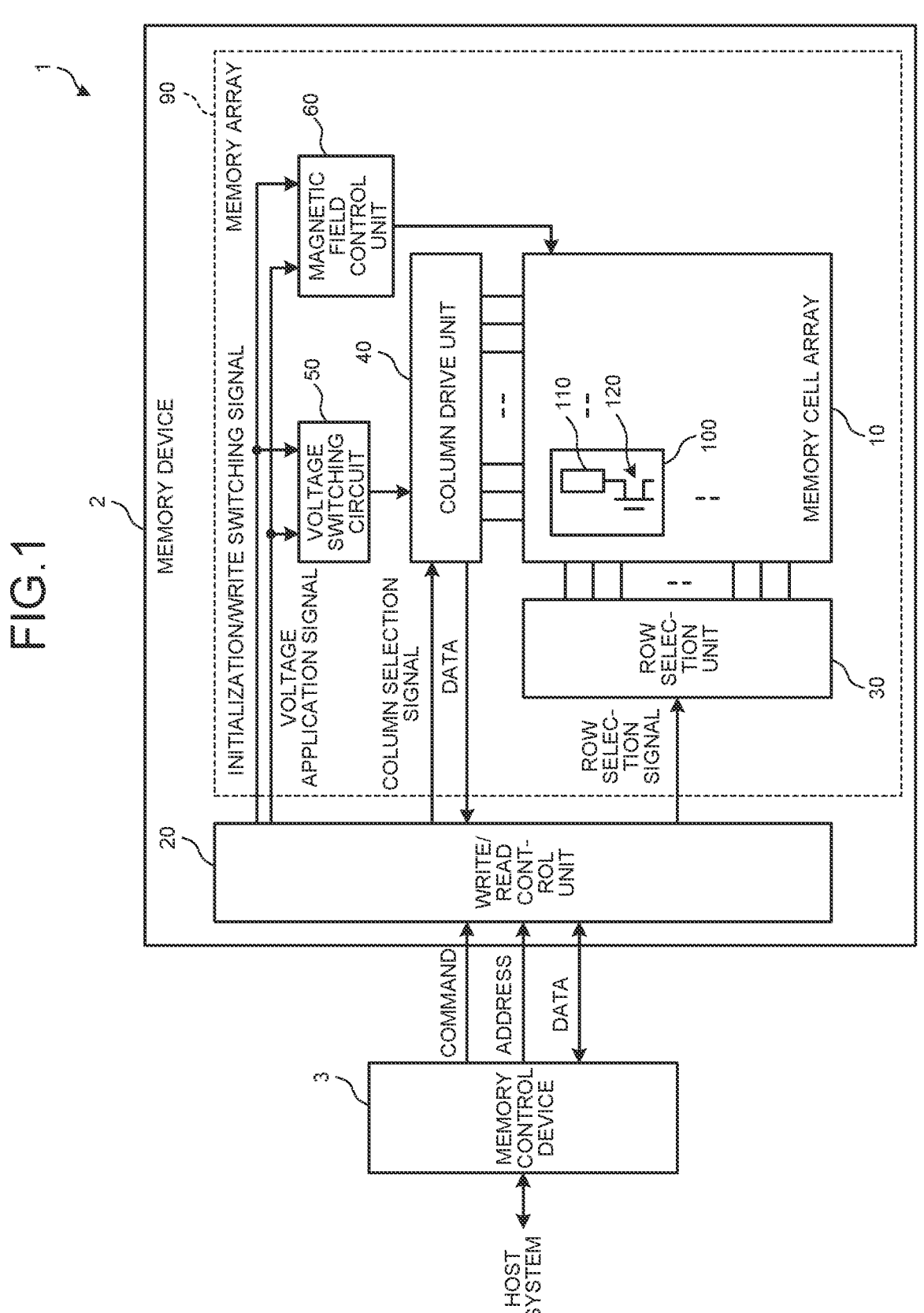
FIG. 1 is a diagram illustrating an exemplary configuration of a memory system according to a first embodiment of the present disclosure.

FIG. 1 is a diagram illustrating an exemplary configuration of a memory system according to a first embodiment of the present disclosure. FIG. 1 is a block diagram illustrating an exemplary configuration of the memory system 1. The memory system 1 is a storage device that stores data, and stores data and outputs the stored data with a host system or the like. The memory system 1 includes a memory device 2 and a memory control device 3.

The memory device 2 includes a memory array 90 that has a plurality of storage elements and a control unit that controls the memory array 90.

The memory control device 3 communicates with the host system or the like. The memory control device 3 receives a command from the host system or the like, and controls writing and reading data on the basis of the received command. The memory control device 3 of FIG. 1 outputs write and read commands and addresses, and data to be written, to the memory device 2. In addition, after outputting the read command, the memory control device 3 receives read data from the memory device 2.

The memory device 2 includes a write/read control unit 20, a memory cell array 10, a row selection unit 30, a column drive unit 40, a voltage switching circuit 50, and a magnetic field control unit 60.

The memory cell array 10 includes two-dimensional matrix arrangement of memory cells 100 to store data. The memory cells 100 each include a magnetic memory element 110 and a cell transistor 120.

For the magnetic memory element 110, for example, a magneto resistive effect element such as a magnetic tunnel junction (MTJ) element can be used. The MTJ element is an element that has a non-magnetic insulating layer disposed between two ferromagnetic layers and that has a resistance value changing according to a magnetization direction of each of the two ferromagnetic layers. The MTJ element has a high resistance state when the magnetization directions of the two ferromagnetic layers are different, and has a low resistance state when the magnetization directions are the same. Note that the state in which the magnetization directions are the same is referred to as a parallel state, and the state in which the magnetization directions are different is referred to as an anti-parallel state. The magnetization direction can be changed by applying a write voltage to the MTJ element. For example, the values "0" and "1" can be associated with the high resistance state and the low resistance state of the MTJ element, respectively, to store 1-bit data. The values "0" and "1" can also be referred to as a low level voltage (L) and a high level voltage (H).

The cell transistor 120 is an element that is connected to one end of the magnetic memory element 110 to control application of voltage to the magnetic memory element 110. The cell transistor 120 can include, for example, an n-channel MOS transistor.

The row selection unit 30 selects a row signal line of the memory cell array 10 on the basis of a row selection signal from the write/read control unit 20. As described later, the row signal line corresponds to a word line.

The column drive unit 40 selects a column signal line of the memory cell array 10 on the basis of a column selection signal from the write/read control unit 20. As described later, the column signal line corresponds to a bit line and a source line. In addition, the column drive unit 40 reads data by detecting a current flowing through the memory cell 100, upon reading. The read data is output to the write/read control unit 20.

The voltage switching circuit 50 switches and outputs a drive voltage to be applied to the magnetic memory element 110, upon initialization or writing. The voltage switching circuit 50 outputs the drive voltage to the column drive unit 40. The voltage switching circuit 50 receives an initialization/write switching signal and a voltage application signal that are input from the write/read control unit 20. The initialization/write switching signal is a signal switching a mode between initialization and writing. The voltage application signal is a signal indicating timing of applying the voltage or the like to the memory cell 100. Here, the initialization is to set the stored data in the memory cell 100 to have a predetermined value, for example, a value "0". The writing is to set the stored data in the memory cell 100 after initialization to have a value "1". As described later, the initialization and writing are performed upon a write process.

The magnetic field control unit 60 controls a current in a magnetic field application line (magnetic field application line 61), which is described later, to control a magnetic field applied to the magnetic memory element 110. The initialization/write switching signal and the voltage application signal from the write/read control unit 20 are also input to the magnetic field control unit 60.

The write/read control unit 20 controls writing and reading in the magnetic memory element 110. The write/read control unit 20 performs processing for writing and reading on the basis of the commands from the memory control device 3. When the write command is input from the memory control device 3, the write/read control unit 20 performs the write process by using the address and data input together with the write command. The write process can be performed in the order of selection of, initialization of, and writing to a memory cell 100 as a target for writing.

The selection of the memory cell 100 as a target for writing can be performed by generating the row selection signal and the column selection signal for the memory cell 100 as the target, on the basis of the input address, and outputting the signals to the row selection unit 30 and the column drive unit 40.

The initialization is to set the stored data in the memory cell 100 to have a value "0", as described above. In the memory cell 100 of FIG. 1, the magnetic memory element 110 is brought into the anti-parallel state which is the high resistance state, by initialization.

Writing is achieved by performing state inversion to bring the magnetic memory element 110 in the anti-parallel state into the parallel state by initialization, and setting the stored data in the memory cell 100 to have the value "1". This state inversion can be performed by applying a state inversion voltage and a state inversion magnetic field, to the magnetic memory element 110 having been initialized. Note that different state inversion voltages can be applied to the magnetic memory element 110 for the initialization and the writing. Similarly, different state inversion magnetic fields can be applied to the magnetic memory elements 110 for the initialization and the writing. The write/read control unit 20 outputs the initialization/write switching signal described above to the voltage switching circuit 50 and the magnetic field control unit 60 to control the state inversion voltage and the state inversion magnetic field applied to the memory cell 100.

Note that the writing described above is processing performed, for the memory cell 100 in which write data will have a value of "1". Only initialization is performed, for the memory cell 100 in which the write data will have a value of "0".

The processing for reading can be performed by selecting a memory cell 100 as a target for reading. The write/read control unit 20 generates the row selection signal and the column selection signal for the memory cell 100 as the target, on the basis of the address input together with the read command, and outputs the signals to the row selection unit 30 and the column drive unit 40. Then, the column drive unit 40 inputs the data read by reading data as described above, to the write/read control unit 20. The write/read control unit 20 outputs the input data to the memory control device 3 and finishes the processing for reading.

Note that the write/read control unit 20 is an example of a write control unit as set forth in the claims.

[Memory Cell]

Figure 2:
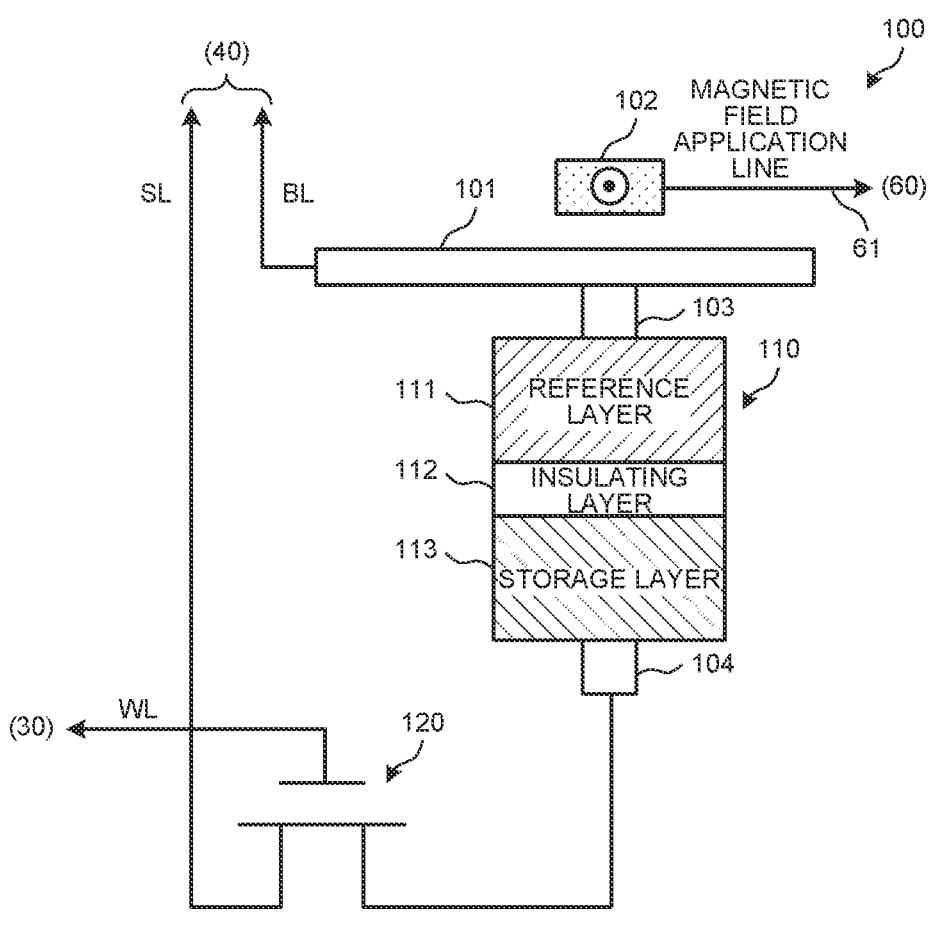
FIG. 2 is a diagram illustrating an exemplary configuration of a memory cell according to an embodiment of the present disclosure.

FIG. 2 is a diagram illustrating an exemplary configuration of a memory cell according to an embodiment of the present disclosure. FIG. 2 is a schematic diagram illustrating an exemplary configuration of the memory cell 100. As described above, the memory cell 100 includes the magnetic memory element 110 and the cell transistor 120.

The magnetic memory element 110 includes a reference layer 111, an insulating layer 112, and a storage layer 113 that are sequentially stacked. The magnetic memory element 110 of FIG. 2 is connected to wiring 101 and the like via plugs 103 and 104.

The reference layer 111 is a magnetic body having a fixed magnetization direction, and includes an artificial lattice containing cobalt (Co) and platinum (Pt).

The insulating layer 112 is also referred to as tunnel barrier layer, and insulates the reference layer 111 and the storage layer 113 from each other. The insulating layer 112 can include, for example, magnesium oxide (MgO).

The storage layer 113 is a magnetic body having a reversible magnetization direction, and the magnetic body includes at least two of cobalt (Co), iron (Fe), and boron (B).

The cell transistor 120 has a drain that is connected to the via plug 104 on the side of the storage layer 113 of the magnetic memory element 110, and has a source that is connected to a source line SL. Furthermore, the cell transistor 120 has a gate that is connected to a word line WL. Note that the via plug 103 on the side of the reference layer 111 of the magnetic memory element 110 is connected to the wiring 101 forming a bit line BL. Applying an on-voltage to the bit line BL makes it possible to make the cell transistor 120 conductive and apply a current corresponding to the applied voltage to the magnetic memory element 110.

As described above, the word line WL is connected to the row selection unit 30. The bit line BL and the source line SL are connected to the column drive unit 40. Applying a voltage between the bit line BL and the source line SL along with the on-voltage making the cell transistor 120 conductive to the word line WL makes it possible to apply the voltage for writing and reading to the magnetic memory element 110.

In addition, in the memory cell 100 of FIG. 2, wiring 102 forming the magnetic field application line 61 is arranged. The magnetic field application line 61 forms the magnetic field by the current flowing through the magnetic field application line 61 and applies the magnetic field to the magnetic memory element 110. The magnetic field application line 61 (wiring 102) of FIG. 2 is arranged in the vicinity of the reference layer 111 and arranged in a direction orthogonal to the wiring 101 forming the bit line BL. A symbol ⊙ in FIG. 2 represents the direction of the current. As illustrated in FIG. 2, the current flowing through the magnetic field application line 61 (wiring 102) is directed toward the back side of the drawing. With this current, a magnetic field in a direction perpendicular to a direction in which the reference layer 111 and the storage layer 113 are stacked is applied to the magnetic memory element 110. Applying the voltage and magnetic field makes it possible to perform writing and the like of data for the magnetic memory element 110.

[Magnetic Memory Element]

Figure 3A:
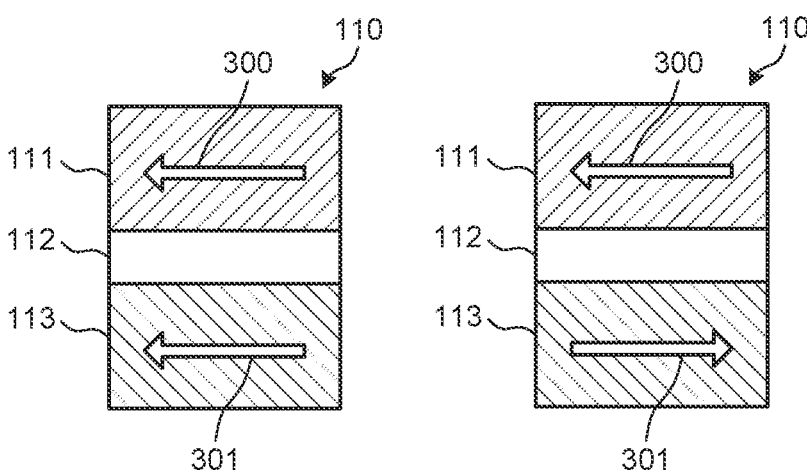
FIG. 3A is a diagram illustrating an exemplary state of a magnetic memory element according to an embodiment of the present disclosure.
Figure 3B:
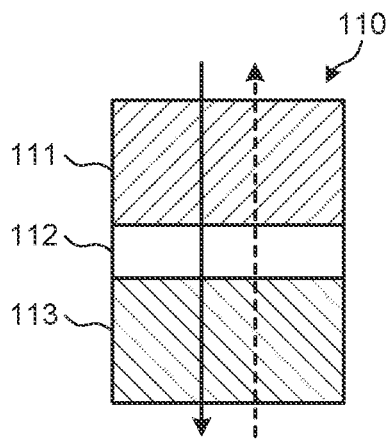
FIG. 3B is a diagram illustrating an exemplary state of the magnetic memory element according to the embodiment of the present disclosure.
Figure 3C:
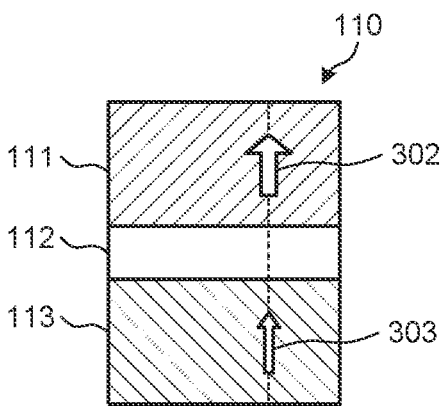
FIG. 3C is a diagram illustrating an exemplary state of the magnetic memory element according to the embodiment of the present disclosure.

FIGS. 3A, 3B, and 3C illustrate diagrams of exemplary states of a magnetic memory element according to an embodiment of the present disclosure. FIGS. 3A, 3B, and 3C illustrate diagrams of the states of the magnetic memory element 110.

FIG. 3A is a diagram illustrating the parallel state and the anti-parallel state. In FIG. 3A, white arrows indicate the magnetization directions. The left side of FIG. 3A illustrates the parallel state in which a magnetization direction 300 in the reference layer 111 and a magnetization direction 301 in the storage layer 113 indicate the same direction. On the other hand, the right side of FIG. 3A illustrates the anti-parallel state in which the magnetization direction 300 of the reference layer 111 and the magnetization direction 301 of the storage layer 113 indicate different directions. In this way, the magnetization direction of the reference layer 111 is constant, and the magnetization direction of the storage layer 113 changes to the parallel state and the anti-parallel state. As described above, the magnetic memory elements 110 is brought into the low resistance state in the parallel state, and the high resistance state in the anti-parallel state. Applying a voltage to the magnetic memory element 110 makes it possible to reverse the magnetization direction of the storage layer 113.

FIG. 3B illustrates voltages applied to the magnetic memory element 110. A solid arrow in FIG. 3B represents a voltage applied to reverse the magnetization direction of the storage layer 113. Furthermore, a dotted arrow in FIG. 3B represents a voltage applied to read data from the magnetic memory element 110. The voltage applied for reading can have a direction different from that of the voltage applied to reverse the magnetization direction of the storage layer 113.

FIG. 3C illustrates an example in which an auxiliary magnetic field supporting the transition from the parallel state to the anti-parallel state is applied. The reference layer 111 of FIG. 3C has a magnetic field 302. A stray field 303 of the magnetic field 302 spreading to the storage layer 113 causes asymmetric deformation in the energy potential which is described later. Note that the reference layer 111 is an example of an auxiliary magnetic field application unit as set forth in the claims.

[Writing and Reading]

Figure 4A:
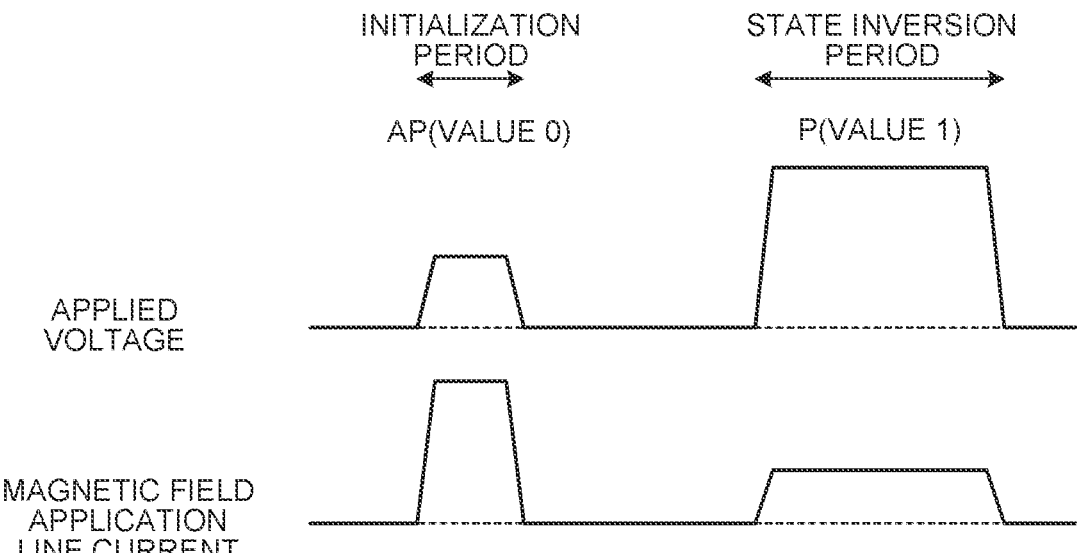
FIG. 4A is a diagram illustrating an example of writing and reading in the magnetic memory element according to an embodiment of the present disclosure.
Figure 4B:
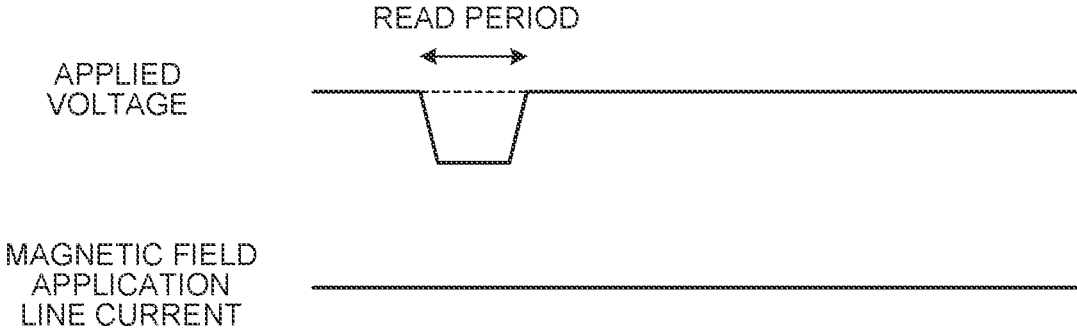
FIG. 4B is a diagram illustrating the example of writing and reading in the magnetic memory element according to the embodiment of the present disclosure.

FIGS. 4A and 4B are diagrams each illustrating an example of writing and reading in the magnetic memory element according to an embodiment of the present disclosure. FIGS. 4A and 4B are diagrams each illustrating a voltage and a magnetic field applied upon data writing and reading in the magnetic memory element 110. The applied voltage in each of FIGS. 4A and 4B is represented by a waveform of the voltage applied to the magnetic memory element 110. In addition, a magnetic field application line current in each of FIGS. 4A and 4B represents a current flowing through the magnetic field application line 61. A broken line in each of FIGS. 4A and 4B indicates a level at which the voltage or current has a value "0".

FIG. 4A illustrates waveforms for writing data. Data is written in two steps of initialization and state inversion. The initialization is processing of bringing the magnetic memory element 110 into the anti-parallel state (AP). When the anti-parallel state corresponds to the value "0", the stored data in the magnetic memory element 110 changes to a value of "0" by initialization. The state inversion is processing of inverting the magnetic memory element 110 from the anti-parallel state to the parallel state (P) when the write data has a value different from the value after the initialization. In the example of FIG. 4A, when the write data has the value "1", state inversion is performed to bring the magnetic memory element 110 into the parallel state. Note that when the write data has the value "0", only initialization is performed.

In the initialization, a relatively low voltage is applied to the magnetic memory element 110. At the same time, a relatively large current is applied to the magnetic field application line 61. Therefore, a relatively strong magnetic field is applied to the magnetic memory element 110. Furthermore, an initialization period corresponding to a pulse width of the applied voltage or the like is set to a relatively short period. Note that the applied voltage and the applied magnetic field for initialization are referred to as an initialization voltage and an initialization magnetic field, respectively.

In the state inversion, a relatively high voltage is applied to the magnetic memory element 110. At the same time, a relatively small current is applied to the magnetic field application line 61. Therefore, a relatively weak magnetic field is applied to the magnetic memory element 110. Furthermore, a state inversion period corresponding to the pulse width of the applied voltage or the like is set to a relatively long period. Note that the applied voltage and the applied magnetic field for the state inversion are referred to as the state inversion voltage and the state inversion magnetic field, respectively.

FIG. 4B illustrates waveforms for reading. For reading, a voltage having a polarity different from that of the state inversion is applied. Meanwhile, it is not necessary to apply a current to the magnetic field application line 61.

[Energy Potential]

Figure 5A:
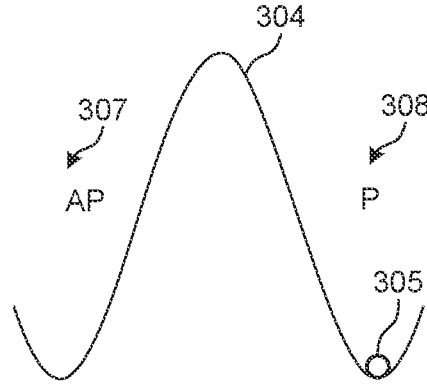
FIG. 5A is a diagram illustrating an example of an energy potential of a magnetic memory element in the conventional art.
Figure 5B:
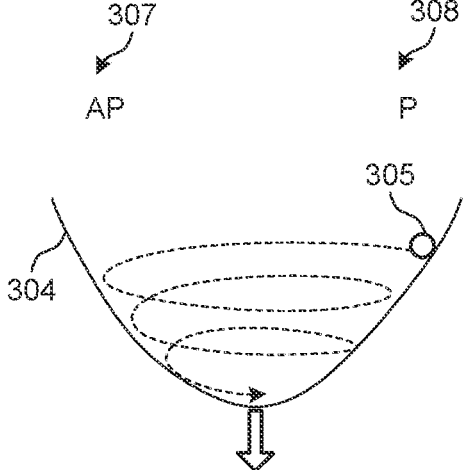
FIG. 5B is a diagram illustrating an example of an energy potential of the magnetic memory element in the conventional art.
Figure 5C:
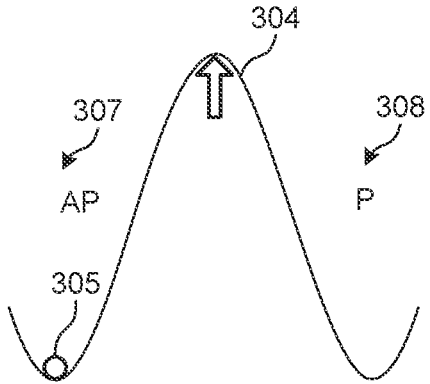
FIG. 5C is a diagram illustrating an example of an energy potential of the magnetic memory element in the conventional art.

FIGS. 5A, 5B, and 5C are diagrams each illustrating an example of an energy potential of the magnetic memory element in the conventional art. FIGS. 5A, 5B, and 5C are diagrams each illustrating an energy potential in the parallel state and the anti-parallel state in the conventional art, as a comparative example. FIGS. 5A, 5B, and 5C are diagrams each illustrating the energy potential in mutual transition between the parallel state and the anti-parallel state. In each of FIGS. 5A, 5B, and 5C, a curve represents an energy potential 304. The energy potential 304 separates a parallel state (P) 308 and an anti-parallel state (AP) 307. A circle in each of FIGS. 5A, 5B, and 5C represents a current state 305 of the magnetic memory element 110.

FIG. 5A illustrates an energy potential in a steady state. In FIG. 5A, the state 305 is in the parallel state (P). In this state, the state 305 is held because the energy potential 304 is high.

FIG. 5B illustrates a state in which a voltage is applied to the magnetic memory element 110. When a voltage is applied, the energy potential 304 decreases, and the magnetization direction of the storage layer 113 rotates. Therefore, the state 305 precesses between the parallel state 308 and the anti-parallel state 307. A dotted arrow in FIG. 5B represents this precession. Stopping the application of the voltage upon transition of the state 305 to the opposite direction caused by the precession makes it possible to invert the state.

FIG. 5C illustrates a state in which the application of the voltage is stopped at the moment of transition of the state 305 to the anti-parallel state 307 caused by the precession. In this way, also in the magnetic memory element 110 of the conventional art, mutual transition between the parallel state and the anti-parallel state can be performed. However, in the precession, the width of the transition is reduced toward the bottom of the energy potential 304, and therefore, it is difficult to control the timing. Therefore, there is a problem that the probability of mutual transition between the parallel state and the anti-parallel state decreases.

Figure 6A:
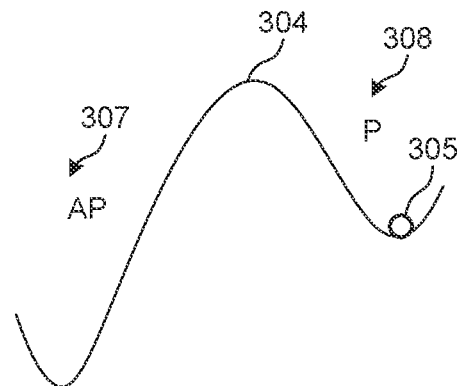
FIG. 6A is a diagram illustrating an example of an energy potential of the magnetic memory element according to an embodiment of the present disclosure.
Figure 6B:
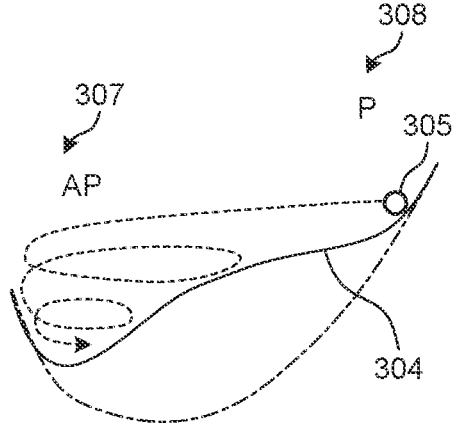
FIG. 6B is a diagram illustrating an example of an energy potential of the magnetic memory element according to the embodiment of the present disclosure.

FIGS. 6A and 6B are diagrams each illustrating an example of an energy potential of the magnetic memory element according to an embodiment of the present disclosure. In the magnetic memory element 110 of the present disclosure, the auxiliary magnetic field illustrated in FIG. 3C is applied. The auxiliary magnetic field changes the energy potential 304.

FIG. 6A illustrates an energy potential in a steady state. In the magnetic memory element 110 of the present disclosure, the energy potential 304 is changed by the auxiliary magnetic field, and the potential of the parallel state (P) is higher than the potential of the anti-parallel state (AP).

FIG. 6B illustrates a state in which a voltage is applied to the magnetic memory element 110. A solid line in FIG. 6B represents the energy potential 304 when the initialization voltage is applied. Applying the initialization voltage having a relatively low voltage, the energy potential 304 has a shape in which the bottom is displaced to the anti-parallel state (AP), and the state 305 performs precession in a region of the anti-parallel state (AP). Therefore, the transition from the parallel state (P) to the anti-parallel state (AP) can be facilitated. Furthermore, at this time, a relatively large initialization magnetic field is applied. The period of the precession is proportional to the inverse of the magnetic field, and therefore, applying a strong magnetic field can provide rapid precession. This configuration makes it possible to perform initialization that is transition from the parallel state (P) to the anti-parallel state (AP) in a short time.

In addition, an alternate long and short dash line in FIG. 6B represents the energy potential 304 in a case where the state inversion voltage is applied. Applying the state inversion voltage having a relatively high voltage makes it possible to lower the bottom of the energy potential 304 relative to that of the anti-parallel state (AP). This configuration provides the precession similar to that in FIG. 5B, making it possible to perform transition from the anti-parallel state (AP) to the parallel state (P). At this time, applying a relatively small state inversion magnetic field makes it possible to delay the precession. It is possible to readily set the timing of transition from the anti-parallel state (AP) to the parallel state (P).

[State Inversion]

Figure 7:
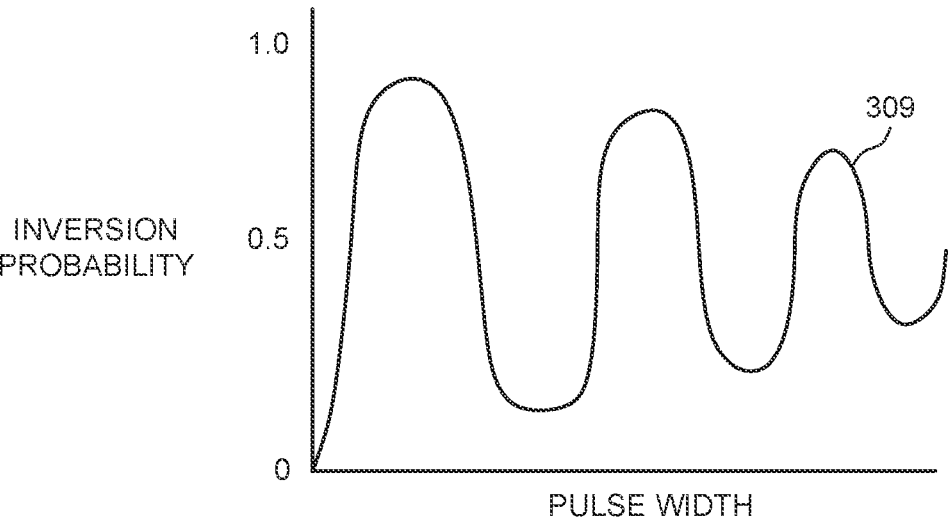
FIG. 7 is a graph illustrating an example of state inversion according to an embodiment of the present disclosure.

FIG. 7 is a graph illustrating an example of state inversion according to an embodiment of the present disclosure. FIG. 7 is a graph illustrating a relationship between the pulse width of the state inversion voltage and an inversion probability from the anti-parallel state to the parallel state, in the magnetic memory element 110. A graph 309 of FIG. 7 represents a change in inversion probability with respect to a change in pulse width of the state inversion voltage. Due to the precession, the inversion probability changes periodically. In addition, as the pulse width increases, the inversion probability gradually approaches 0.5. Therefore, it is necessary to set the inversion voltage to have a pulse width at which the inversion probability is closer to 1.0. Weakening the inverted magnetic field increases the period of the precession, making it possible to readily set the pulse width.

[Write Process]

FIG. 8 is a flowchart illustrating an example of a process procedure of the write process according to the first embodiment of the present disclosure. FIG. 8 is a flowchart illustrating an example of the process procedure of the write process in the memory device 2.

First, the write/read control unit 20 sets initialization parameters to the voltage switching circuit 50 and the magnetic field control unit 60 (Step S100). The initialization parameters correspond to the initialization voltage, the initialization magnetic field, and the pulse width (initialization period). Next, the voltage switching circuit 50 and the magnetic field control unit 60 perform initialization (Step S101). Next, the write/read control unit 20 determines whether the write data has the value "1" (Step S102). As a result, when the write data does not have the value "1" (Step S102, No), the process proceeds to Step S107. On the other hand, when the write data has the value "1" (Step S102, Yes), state inversion parameters are set (Step S103). The state inversion parameters correspond to the state inversion voltage, the state inversion magnetic field, and the pulse width (state inversion period).

Next, the voltage switching circuit 50 and the magnetic field control unit 60 perform state inversion (Step S104). Next, the write/read control unit 20 performs verification (Step S105). The verification can be performed by reading data from the memory cell 100 as a target for writing, for examination. When the read data and the write data do not match (Step S106, No), the process proceeds to Step S104. On the other hand, when the read data matches the write data (Step S106, Yes), the write/read control unit 20 outputs a write completion notification to the memory control device 3 (Step S107). The above process enables writing.

[Other Examples of Write Process]

Figure 9:
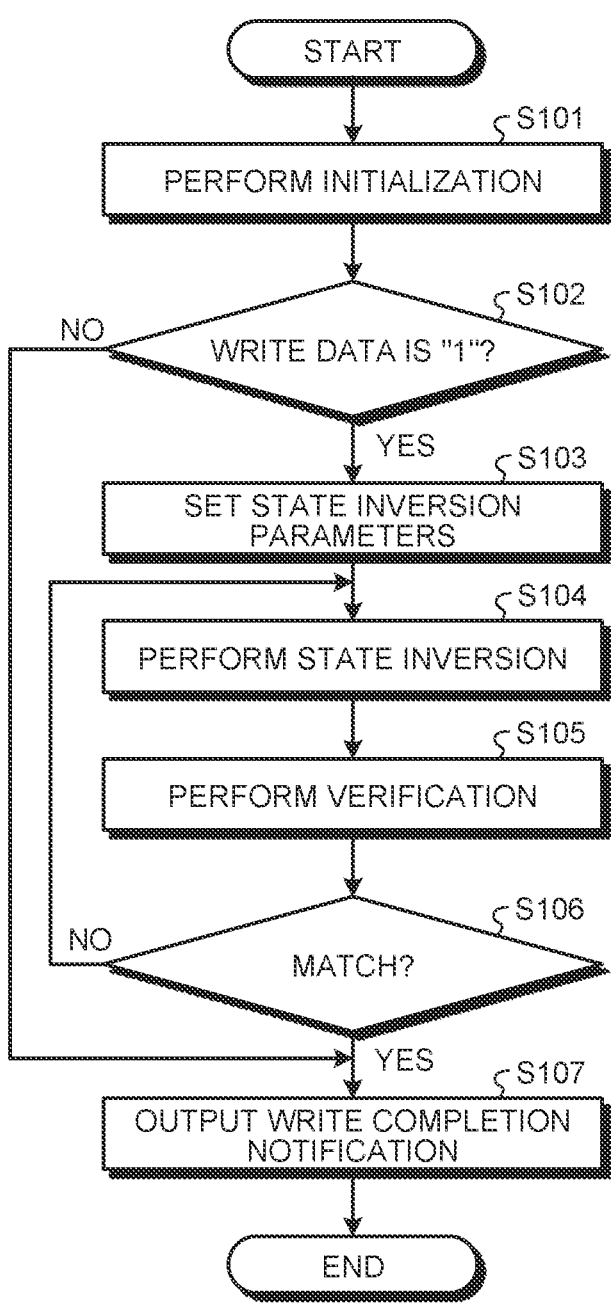
FIG. 9 is a flowchart illustrating another example of the process procedure of the write process according to the first embodiment of the present disclosure.

FIG. 9 is a flowchart illustrating another example of the process procedure of the write process according to the first embodiment of the present disclosure. The process of FIG. 9 is represented in a flowchart illustrating an example in which the voltage switching circuit 50 and the magnetic field control unit 60 hold the initialization parameters as default values. The process of FIG. 9 corresponds to the process of FIG. 8 from which Step S100 is omitted.

Figure 10:
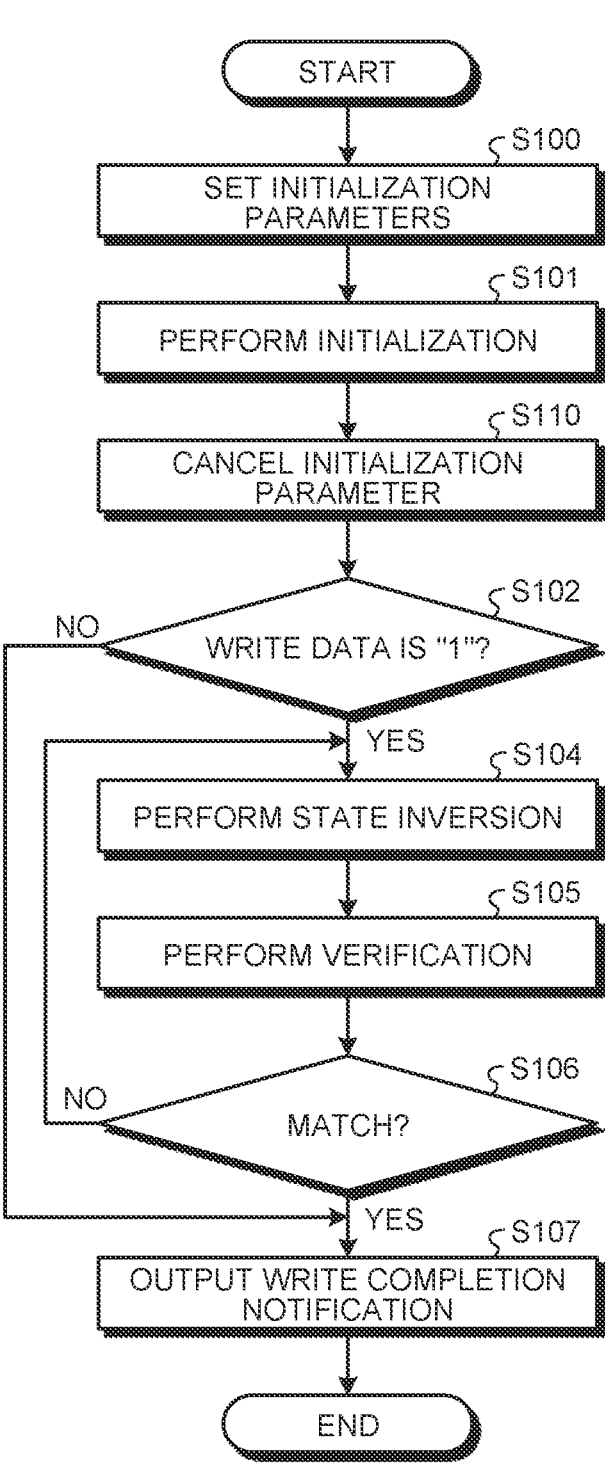
FIG. 10 is a flowchart illustrating another example of the process procedure of the write process according to the first embodiment of the present disclosure.

FIG. 10 is a flowchart illustrating another example of the process procedure of the write process according to the first embodiment of the present disclosure. The process of FIG. 10 is represented in a flowchart illustrating an example in which the voltage switching circuit 50 and the magnetic field control unit 60 hold the state inversion parameters as default values. The process of FIG. 10 corresponds to the process of FIG. 8 from which Step S103 is omitted.

[Another Configuration of Memory Cell]

Figure 11:
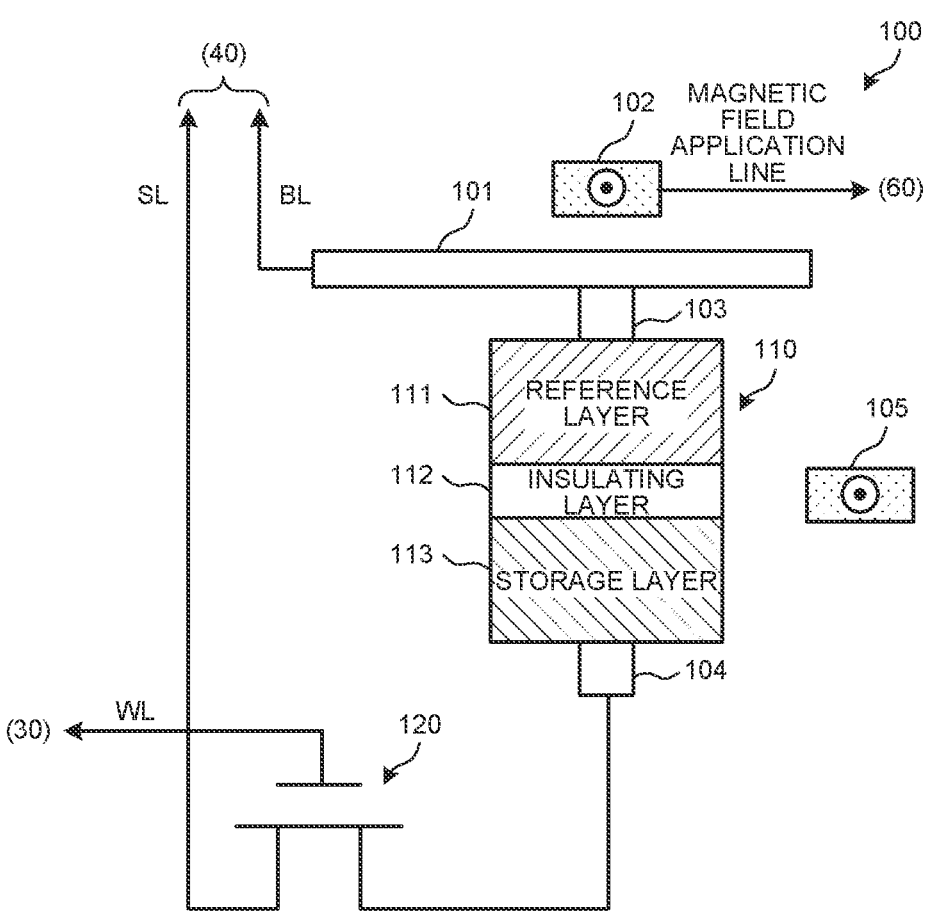
FIG. 11 is a diagram illustrating another exemplary configuration of the memory cell according to an embodiment of the present disclosure.

FIG. 11 is a diagram illustrating another exemplary configuration of the memory cell according to an embodiment of the present disclosure. FIG. 11 is a schematic diagram illustrating an exemplary configuration of the memory cell 100, similarly to FIG. 2. The memory cell 100 of FIG. 11 is different from the memory cell 100 of FIG. 2 in that wiring 105 is further provided. The wiring 105 is arranged near a side of the magnetic memory element 110 to generate a magnetic field by a current passing through the wiring 105 and apply the magnetic field to the magnetic memory element 110. This magnetic field serves as the auxiliary magnetic field illustrated in FIG. 3C, and the auxiliary magnetic field substantially perpendicular to the magnetic memory element 110 can be applied.

As described above, in the memory device 2 according to the first embodiment of the present disclosure, the magnetic field is applied to the magnetic memory element 110 to perform initialization, and therefore, it is possible to reduce a time period required for initialization. Applying the initialization to the write process makes it possible to reduce a time period required for writing.

2. Second Embodiment

The memory device 2 of the first embodiment described above includes the single memory array 90. On the other hand, the memory device 2 according to a second embodiment of the present disclosure is different from the first embodiment described above in that a plurality of memory arrays 90 is provided.

[Configuration of Memory Device 2]

Figure 12:
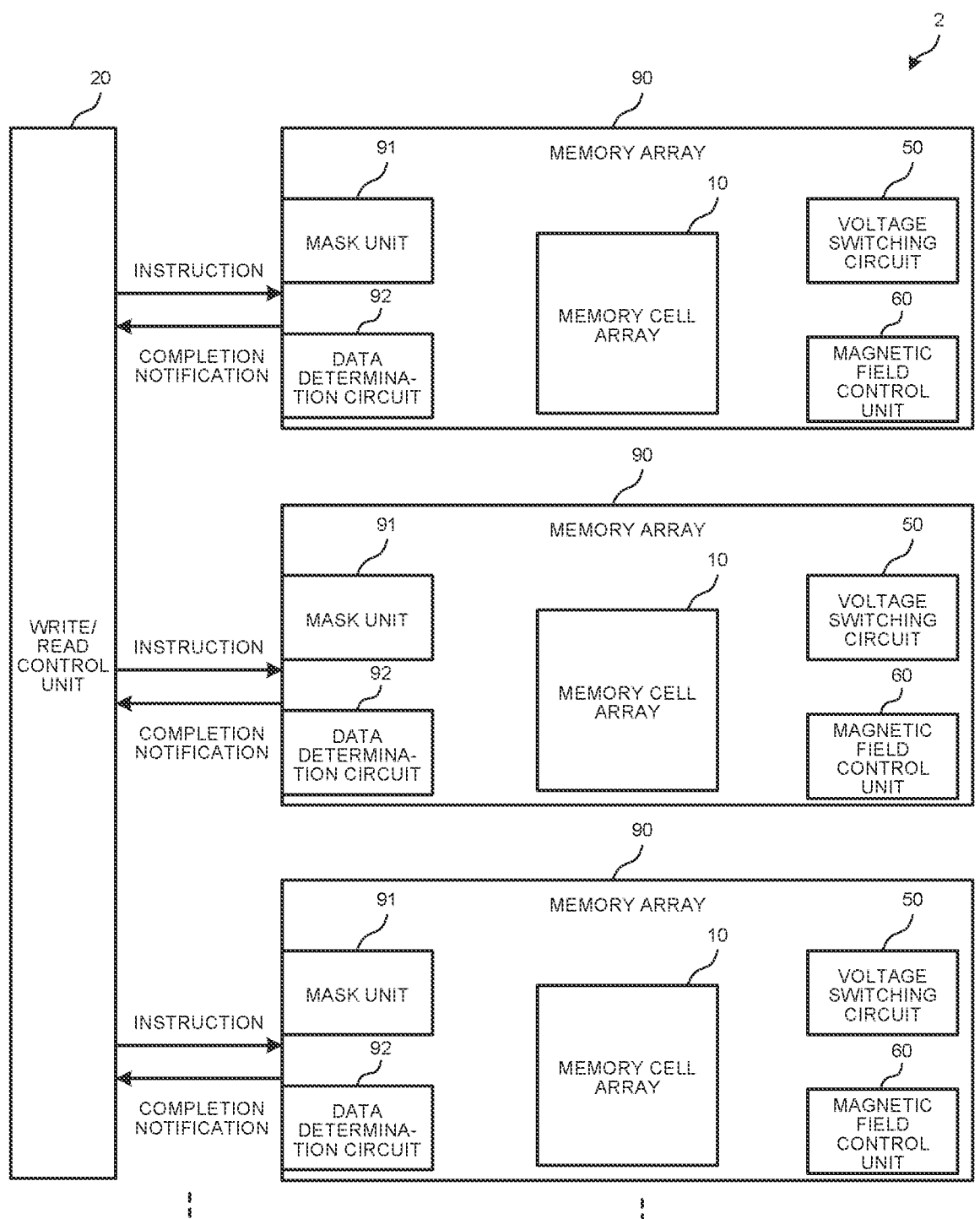
FIG. 12 is a diagram illustrating an exemplary configuration of a memory device according to a second embodiment of the present disclosure.

FIG. 12 is a diagram illustrating an exemplary configuration of the memory device according to the second embodiment of the present disclosure. The memory device 2 of FIG. 12 includes the plurality of memory arrays 90. Note that the illustration of each of the memory array 90 is simplified in FIG. 12. The memory array 90 of FIG. 12 further includes a mask unit 91 and a data determination circuit 92.

The data determination circuit 92 has a function of determining whether the write data has the value "0" and a function of determining whether the data match each other by verification. When matching of the data is determined by the verification, the data determination circuit 92 outputs a completion notification.

The mask unit 91 has a function of masking the voltage application signal to stop the execution of writing, after the data determination circuit 92 determines that writing is unnecessary.

The write/read control unit 20 performs control of initialization and normal state inversion for all the memory arrays 90, and performs control to complete writing by receiving the completion notification from all the memory arrays 90.

[Write Process]

Figure 13:
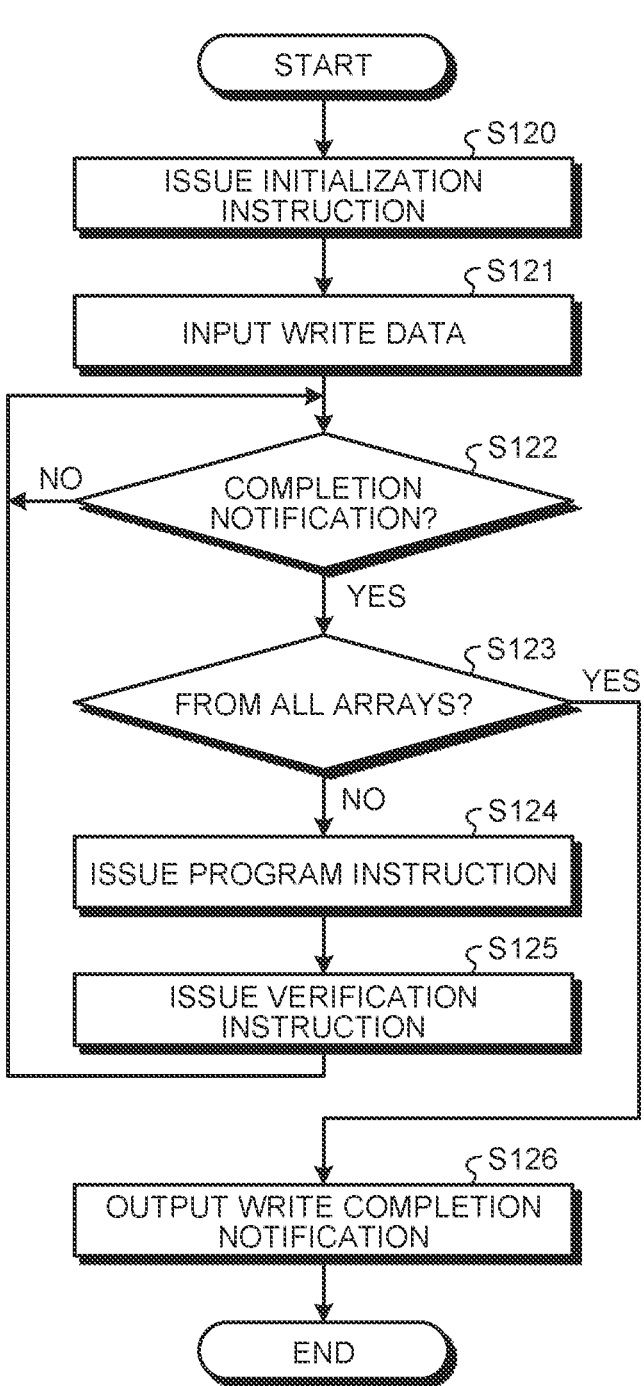
FIG. 13 is a flowchart illustrating an example of a process procedure of a write process according to the second embodiment of the present disclosure.

FIG. 13 is a flowchart illustrating an example of a process procedure of a write process according to the second embodiment of the present disclosure. FIG. 13 is a flowchart illustrating an example of the process procedure of the write process in the memory device 2.

First, the write/read control unit 20 issues an initialization instruction to the memory array 90 (Step S120). Next, the write/read control unit 20 inputs the write data (Step S121). Next, the write/read control unit 20 waits for the completion notification output from the memory array 90 (Step S122, No). When the completion notification is output from the memory array 90 (Step S122, Yes), the write/read control unit 20 determines whether the completion notification is output from all the memory arrays 90 (Step S123).

As a result, when the completion notification is output from all the memory arrays 90 (Step S123, Yes), the process proceeds to the processing of Step S126. On the other hand, when the completion notification is not output from all the memory arrays 90 (Step S123, No), a program instruction is issued (Step S124). This program instruction is an instruction for initialization and state inversion. Next, the write/read control unit 20 issues a verification instruction (Step S125). Thereafter, the write/read control unit 20 performs the processing in Step S122 and the subsequent steps again.

In Step S126, the write/read control unit 20 outputs the write completion notification (Step S126), and finishes the write process. The above process enables writing.

The configurations of the memory device 2 other than this configuration are similar to the configurations of the memory device 2 in the first embodiment of the present disclosure, and the description thereof will be omitted.

As described above, the memory device 2 according to the second embodiment of the present disclosure simultaneously performs the write process for the plurality of memory arrays 90, and therefore, the time period required for writing can be reduced even for the increased memory capacity.

3. Third Embodiment

The memory device 2 of the second embodiment described above includes the plurality of memory arrays 90. Meanwhile, the memory device 2 according to a third embodiment of the present disclosure is different from that of the second embodiment described above in that an initialization information holding unit 70 is further provided.

[Configuration of Memory Device]

Figure 14:
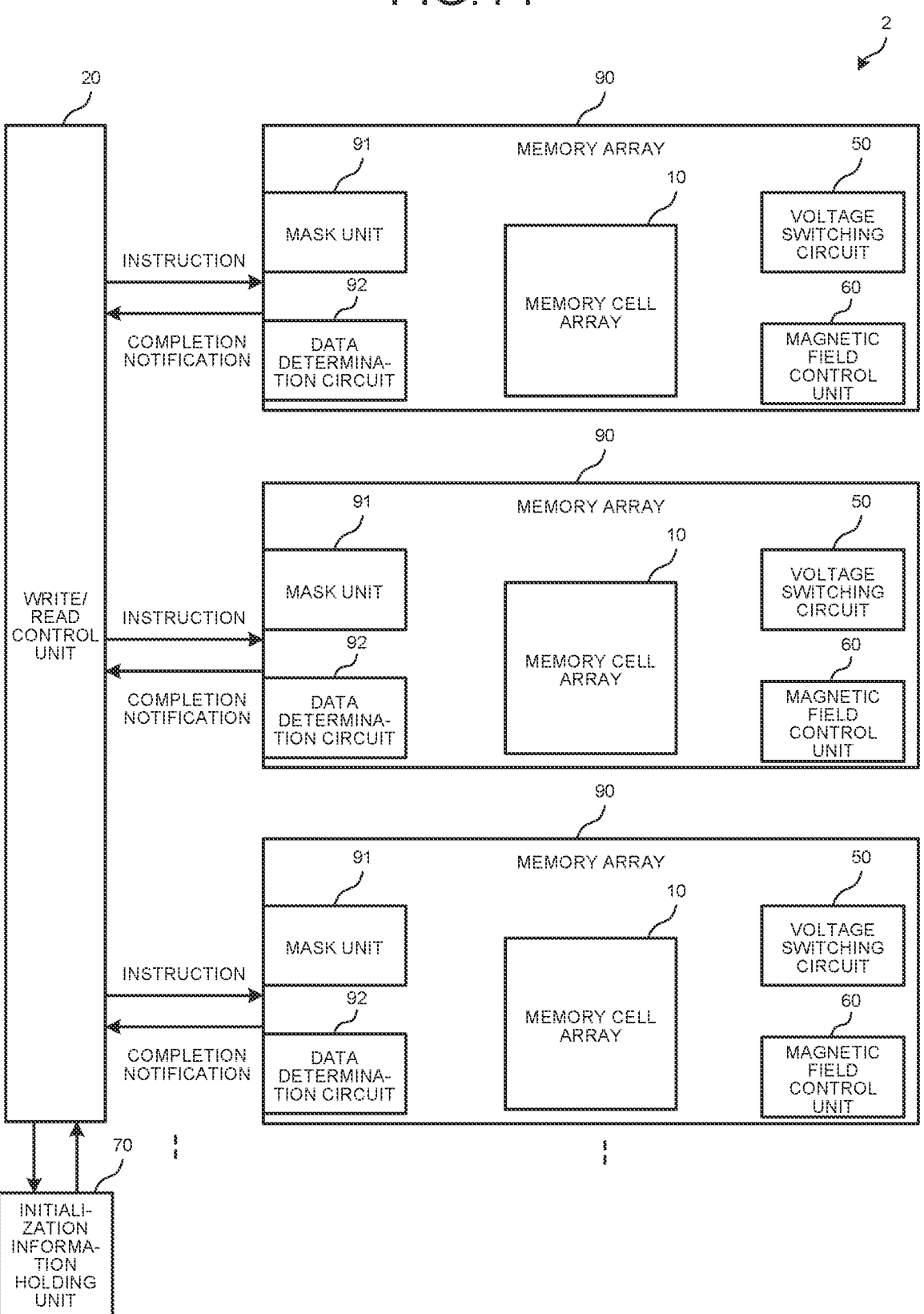
FIG. 14 is a diagram illustrating an exemplary configuration of a memory device according to a third embodiment of the present disclosure.

FIG. 14 is a diagram illustrating an exemplary configuration of a memory device according to a third embodiment of the present disclosure. The memory device 2 of FIG. 14 is different from the memory device 2 of FIG. 12 in that the initialization information holding unit 70 is further provided.

The initialization information holding unit 70 holds information about a memory cell 100 that has an initialized magnetic memory element 110, of the memory cells 100. For example, a table holding information about the initialized magnetic memory element 110 is applicable to the initialization information holding unit 70. The write/read control unit 20 in FIG. 14 issues the initialization instruction to the memory array 90 and causes the initialization information holding unit 70 to hold initialization information.

[Initialization Process]

FIG. 15 is a flowchart illustrating an example of a process procedure of an initialization process according to the third embodiment of the present disclosure. FIG. 15 is a flowchart illustrating an example of the process procedure of the initialization process in the memory device 2.

First, the write/read control unit 20 determines whether a memory array 90 as a target for writing has been initialized (Step S131). The determination is allowed to be performed by referring to the initialization information in the initialization information holding unit 70 by the write/read control unit 20. When the memory array 90 as a target for writing has been initialized (Step S131, Yes), the process proceeds to Step S134. On the other hand, when the memory array 90 as a target for writing has not been initialized (Step S131, No), the write/read control unit 20 performs initialization (Step S132). The initialization is allowed to be performed by issuing the initialization instruction. Next, the write/read control unit 20 updates the initialization information in the initialization information holding unit 70 (Step S133). Next, the write/read control unit 20 outputs an initialization completion notification to the memory control device 3 (Step S134). The initialization can be performed by the above process.

[Write Process]

FIG. 16 is a flowchart illustrating an example of a process procedure of a write process according to the third embodiment of the present disclosure. FIG. 16 is a flowchart illustrating an example of the process procedure of the write process in the memory device 2. The process of FIG. 16 corresponds to the process of FIG. 13 from which the processing in Step S120 is omitted. The process of FIG. 16 is a process on the assumption that the initialization of the memory array 90 has been completed.

In this way, the initialization process and the write process can be separately performed.

[Another Example of Write Process]

FIG. 17 is a flowchart illustrating an example of another process procedure of the write process according to the third embodiment of the present disclosure. The process of FIG. 17 is a process for continuously performing the initialization process of FIG. 15 and the writing process of FIG. 16.

The configurations of the memory device 2 other than this configuration are similar to the configurations of the memory device 2 in the first embodiment of the present disclosure, and the description thereof will be omitted.

As described above, the memory device 2 according to the third embodiment of the present disclosure includes the initialization information holding unit 70 to perform writing by determining whether the memory array 90 has been initialized. This configuration makes it possible to remove an unnecessary initialization process, and a high-speed write process can be provided.

4. Fourth Embodiment

The memory device 2 of the second embodiment described above includes the plurality of memory arrays 90. Meanwhile, the memory device 2 according to a fourth embodiment of the present disclosure is different from that of the second embodiment described above in that the initialization information holding unit 70 is further provided.

[Configuration of Memory Device]

FIG. 18 is a diagram illustrating an exemplary configuration of a memory device according to the fourth embodiment of the present disclosure. The memory device 2 of FIG.

18 is different from the memory device 2 of FIG. 12 in that a data conversion unit 80 is further provided.

The data conversion unit 80 converts the write data. As described above, the memory device 2 inverts the state of the magnetic memory element 110 in which the write data has the value "1" after initialization of setting the magnetic memory element 110 to have the value "0". Therefore, as the data having the value "1" increases, power required for writing increases. Therefore, converting the write data into data having a reduced number of values "1", the power required for writing can be reduced. The data conversion unit 80 performs such data conversion.

[Data Conversion]

FIG. 19 is a diagram illustrating an example of the data conversion according to the fourth embodiment of the present disclosure. FIG. 19 is a diagram illustrating an example of the data conversion in the data conversion unit 80. FIG. 19 illustrates an example of converting 17-bit input data. The input data 320 is data in which the number of values "1" is larger than the number of value "0". In this case, the data can be converted by inverting a logic of the data 320. Data 321 of FIG. 19 is a code indicating the logic inversion. Furthermore, an error correction code can be added. FIG. 19 further illustrates an example of error detection and correction code (ECC) encoding. Data 322 of FIG. 19 is ECC redundant data to be added

[Write Process]

FIG. 20 is a flowchart illustrating an example of a process procedure of a write process according to the fourth embodiment of the present disclosure. First, the write/read control unit 20 converts the write data (Step S140). The conversion can be performed by outputting the data to the data conversion unit 80 and obtaining converted data. Subsequent processing is similar to the processing illustrated in the process of FIG. 13, and the description thereof is omitted.

The configurations of the memory device 2 other than this configuration are similar to the configurations of the memory device 2 in the first embodiment of the present disclosure, and the description thereof will be omitted.

As described above, the memory device 2 of the fourth embodiment of the present disclosure includes the data conversion unit 80 to convert data. Therefore, the power required for writing can be reduced.

Note that the configuration of the third embodiment of the present disclosure can be applied to other embodiments. Specifically, the initialization information holding unit 70 of FIG. 14 is applicable to the fourth embodiment of the present disclosure.

Note that the effects described herein are merely examples and are not limited to the description, and other effects may be provided.

Note that the present technology can also have the following configurations.

(1)

A memory device comprising:

a magnetic memory element that includes a reference layer having a fixed magnetization direction, and a storage layer stacked on the reference layer via an insulating layer and having a reversible magnetization direction, and that stores data in association with two states of a parallel state and an anti-parallel state, the parallel state having the same magnetization directions in the reference layer and the storage layer and the anti-parallel state having different magnetization directions in the reference layer and the storage layer;

an auxiliary magnetic field application unit that applies an auxiliary magnetic field supporting transition of the magnetic memory element from the parallel state to the anti-parallel state; and a write control unit that performs initialization by applying an initialization voltage and an initialization magnetic field to the magnetic memory element to bring the magnetic memory element into the anti-parallel state, and writing by performing state inversion to apply a state inversion voltage and a state inversion magnetic field to the initialized magnetic memory element, according to the data, the state inversion voltage and state inversion magnetic field being used to bring the magnetic memory element in the anti-parallel state, into the parallel state.

(2)

The memory device according to the above (1), wherein the initialization magnetic field is a magnetic field stronger than the state inversion magnetic field.

(3)

The memory device according to the above (1) or (2), wherein the initialization voltage is a voltage lower than the state inversion voltage.

(4)

The memory device according to any one of the above (1) to (3), wherein a period in which the initialization voltage is applied is shorter than a period in which the state inversion voltage is applied.

(5)

The memory device according to any one of the above (1) to (4), further comprising a magnetic field application line that applies the initialization magnetic field and the state inversion magnetic field to the magnetic memory element; and a magnetic field control unit that controls a magnetic field applied to the magnetic memory element by applying a current corresponding to the initialization magnetic field and the state inversion magnetic field to the magnetic field application line, wherein the write control unit further performs control to apply the initialization magnetic field and the state inversion magnetic field to the magnetic memory element via the magnetic field control unit.

(6)

The memory device according to any one of the above (1) to (5), further comprising a data conversion unit that converts the data, wherein the write control unit performs the writing of the converted data.

(7)

The memory device according to the above (6), wherein the data conversion unit converts the data by inverting a logic of the data.

(8)

The memory device according to the above (6), wherein the data conversion unit converts the data by adding a code for error correction to the data.

(9)

The memory device according to any one of the above (1) to (8), comprising a plurality of the magnetic memory elements.

(10)

The memory device according to the above (9), further comprising an initialization information holding unit that holds information about the initialized magnetic memory element of the plurality of the magnetic memory elements, wherein the write control unit performs the initialization based on the information held in the initialization information holding unit.

(11)
A memory system comprising:
a memory including:
    a magnetic memory element that includes a reference layer having a fixed magnetization direction, and a storage layer stacked on the reference layer via an insulating layer and having a reversible magnetization direction, and that stores data in association with two states of a parallel state and an anti-parallel state, the parallel state having the same magnetization directions in the reference layer and the storage layer and the anti-parallel state having different magnetization directions in the reference layer and the storage layer;
    an auxiliary magnetic field application unit that applies an auxiliary magnetic field supporting transition of the magnetic memory element from the parallel state to the anti-parallel state; and
    a write control unit that performs initialization by applying an initialization voltage and an initialization magnetic field to the magnetic memory element to bring the magnetic memory element into the anti-parallel state, and writing by performing state inversion to apply a state inversion voltage and a state inversion magnetic field to the initialized magnetic memory element, according to the data, the state inversion voltage and state inversion magnetic field being used to bring the magnetic memory element in the anti-parallel state, into the parallel state; and
    a memory control unit that controls the write control unit to write data, based on a command from a host system.

REFERENCE SIGNS LIST

1 MEMORY SYSTEM
2 MEMORY DEVICE
3 MEMORY CONTROL DEVICE
10 MEMORY CELL ARRAY
20 WRITE/READ CONTROL UNIT
50 VOLTAGE SWITCHING CIRCUIT
60 MAGNETIC FIELD CONTROL UNIT
70 INITIALIZATION INFORMATION HOLDING UNIT
80 DATA CONVERSION UNIT
90 MEMORY ARRAY
100 MEMORY CELL
101, 102, 105 WIRING
110 MAGNETIC MEMORY ELEMENT
111 REFERENCE LAYER
112 INSULATING LAYER
113 STORAGE LAYER

The invention claimed is:

1. A memory device, comprising:
a magnetic memory element that includes:
    a reference layer, wherein the reference layer has a fixed magnetization direction:
    an insulating layer; and
    a storage layer, wherein
        the storage layer is stacked on the reference layer via the insulating layer,
        the storage layer has a reversible magnetization direction, the storage layer is configured to store a datum in association with two states of a parallel state and an anti-parallel state,
        a first magnetization direction of the reference layer and a second magnetization direction of the storage layer are same in the parallel state, and
        the first magnetization direction of the reference layer and the second magnetization direction of the storage layer are different in the anti-parallel state;
an auxiliary magnetic field application unit configured to apply an auxiliary magnetic field for transition of the magnetic memory element from the parallel state to the anti-parallel state; and
a write control unit configured to:
    execute an initialization process based on an application of an initialization voltage and an initialization magnetic field to the magnetic memory element, wherein
        the initialization voltage and the initialization magnetic field are applied to the magnetic memory element to set the magnetic memory element into the anti-parallel state, and
        the initialization process is executed on the magnetic memory element to generate an initialized magnetic memory element; and
    execute a writing process of the datum based on an application of a state inversion voltage and a state inversion magnetic field to the initialized magnetic memory element, wherein
        the state inversion voltage and the state inversion magnetic field are applied to the initialized magnetic memory element to execute a state inversion process on the initialized magnetic memory element,
        the state inversion process is executed to set the magnetic memory element from the anti-parallel state to the parallel state,
        the state inversion process is executed on the initialized magnetic memory element based on a value of the datum, and
        the initialization magnetic field is stronger than the state inversion magnetic field.

2. The memory device according to claim 1, wherein the initialization voltage is lower than the state inversion voltage.

3. The memory device according to claim 1, wherein a period of the application of the initialization voltage is shorter than a period of the application of the state inversion voltage.

4. The memory device according to claim 1, further comprising
a magnetic field application line configured to apply the initialization magnetic field and the state inversion magnetic field to the magnetic memory element; and
a magnetic field control unit configured to control the initialization magnetic field and the state inversion magnetic field applied to the magnetic memory element, wherein
    the initialization magnetic field and the state inversion magnetic field are controlled based on an application of a current to the magnetic field application line corresponding to each of the initialization magnetic field and the state inversion magnetic field, and
    the write control unit is further configured to control the magnetic field control unit to apply the initialization magnetic field and the state inversion magnetic field to the magnetic memory element.

5. The memory device according to claim 1, further comprising a data conversion unit configured to convert write data to converted data, wherein the write control unit is further configured to write the converted data.

6. The memory device according to claim 5, wherein the data conversion unit is further configured to convert the write data based on inversion of logic bits of the write data.

7. The memory device according to claim 5, wherein the data conversion unit is further configured to add an error correction code to the converted data.

8. The memory device according to claim 1, further comprising a plurality of magnetic memory elements, wherein the plurality of magnetic memory elements includes the magnetic memory element.

9. The memory device according to claim 8, further comprising an initialization information holding unit configured to hold information of the initialized magnetic memory element of the plurality of magnetic memory elements, wherein the write control unit is further configured to execute the initialization process based on the held information.

10. A memory system, comprising:

a memory including:

a magnetic memory element that includes:

a reference layer, wherein the reference layer has a fixed magnetization direction;

an insulating layer; and a storage layer, wherein the storage layer is stacked on the reference layer via the insulating layer, the storage layer has a reversible magnetization direction, the storage layer is configured to store a datum in association with two states of a parallel state and an anti-parallel state, a first magnetization direction of the reference layer and a second magnetization direction of the storage layer are same in the parallel state, and the first magnetization direction of the reference layer and the second magnetization direction of the storage layer are different in the anti-parallel state;

an auxiliary magnetic field application unit configured to apply an auxiliary magnetic field for transition of the magnetic memory element from the parallel state to the anti-parallel state;

a write control unit configured to:

execute an initialization process based on an application of an initialization voltage and an initialization magnetic field to the magnetic memory element, wherein the initialization voltage and the initialization magnetic field is applied to the magnetic memory element to set the magnetic memory element into the anti-parallel state, and the initialization process is executed on the magnetic memory element to generate an initialized magnetic memory element; and execute a writing process of the datum based on an application of a state inversion voltage and a state inversion magnetic field to the initialized magnetic memory element, wherein the state inversion voltage and the state inversion magnetic field is applied to the initialized magnetic memory element to execute a state inversion process on the initialized magnetic memory element, the state inversion process is executed to set the magnetic memory element from the anti-parallel state to the parallel state, the state inversion process is executed on the initialized magnetic memory element based on a value of the datum, and the initialization magnetic field is stronger than the state inversion magnetic field; and a memory control unit configured to control the write control unit to write data, wherein the write control unit is controlled based on a command from a host system.

* * * * *